(12) United States Patent
Kireev et al.

(10) Patent No.: US 9,406,738 B2
(45) Date of Patent: Aug. 2, 2016

(54) INDUCTIVE STRUCTURE FORMED USING THROUGH SILICON VIAS

(75) Inventors: Vassili Kireev, Sunnyvale, CA (US); James Karp, Saratoga, CA (US)

(73) Assignee: XILINX, INC., San Jose, CA (US)

( * ) Notice: Subject to any disclaimer, the term of this patent is extended or adjusted under 35 U.S.C. 154(b) by 930 days.

(21) Appl. No.: 13/187,234

(22) Filed: Jul. 20, 2011

(65) Prior Publication Data

US 2013/0020675 A1 Jan. 24, 2013

(51) Int. Cl.
| | |
|---|---|
| H01L 23/48 | (2006.01) |
| H01L 25/16 | (2006.01) |
| H01L 27/08 | (2006.01) |
| H01L 49/02 | (2006.01) |
| H01L 23/14 | (2006.01) |
| H01L 23/498 | (2006.01) |
| H01L 23/522 | (2006.01) |
| H01L 23/64 | (2006.01) |
| H01L 25/065 | (2006.01) |
| H01L 23/00 | (2006.01) |

(52) U.S. Cl.
CPC .............. *H01L 28/10* (2013.01); *H01L 23/147* (2013.01); *H01L 23/49827* (2013.01); *H01L 23/5227* (2013.01); *H01L 23/645* (2013.01); *H01L 25/0652* (2013.01); *H01L 25/0655* (2013.01); *H01L 25/16* (2013.01); *H01L 23/481* (2013.01); *H01L 24/16* (2013.01); *H01L 2224/131* (2013.01); *H01L 2224/16235* (2013.01); *H01L 2924/15192* (2013.01); *H01L 2924/15311* (2013.01)

(58) Field of Classification Search
CPC ... H01L 23/5227; H01L 23/645; H01L 28/10; H01L 2924/15192
USPC ......... 257/499, 528, 531, 532, 520, 336, 724, 257/904, 924, E21.022, E29.166
See application file for complete search history.

(56) References Cited

U.S. PATENT DOCUMENTS

| | | | |
|---|---|---|---|
| 5,349,743 | A | 9/1994 | Grader et al. |
| 5,880,925 | A | 3/1999 | DuPre et al. |
| 6,031,445 | A | 2/2000 | Marty et al. |
| 6,291,872 | B1 | 9/2001 | Wang et al. |
| 6,342,681 | B1 | 1/2002 | Golderberger et al. |
| 6,407,907 | B1 | 6/2002 | Ahiko et al. |
| 6,459,561 | B1 | 10/2002 | Galvagni et al. |
| 6,477,032 | B2 | 11/2002 | Makl, Jr. |
| 6,477,034 | B1 | 11/2002 | Chakravorty et al. |
| 6,534,249 | B2 | 3/2003 | Fork et al. |
| 6,548,338 | B2 | 4/2003 | Bernstein et al. |

(Continued)

FOREIGN PATENT DOCUMENTS

| | | |
|---|---|---|
| CN | 101866908 A | 10/2010 |
| JP | 2004079701 | 3/2004 |
| WO | 2008100940 | 8/2008 |

OTHER PUBLICATIONS

U.S. Appl. No. 13/275,883, filed Oct. 18, 2011, Chong et al.

(Continued)

*Primary Examiner* — Moazzam Hossain
(74) *Attorney, Agent, or Firm* — Kevin T. Cuenot; Gerald Chan

(57) ABSTRACT

An inductor for an integrated circuit can include a first turn comprising a first through silicon via (TSV) coupled to a second TSV. The inductor can include a third TSV coupled to the second TSV.

19 Claims, 5 Drawing Sheets

(56) References Cited

U.S. PATENT DOCUMENTS

| | | | |
|---|---|---|---|
| 6,606,237 | B1 | 8/2003 | Naito et al. |
| 6,611,188 | B2 | 8/2003 | Yeo et al. |
| 6,614,093 | B2 | 9/2003 | Ott et al. |
| 6,664,881 | B1 | 12/2003 | Thompson et al. |
| 6,759,727 | B2 | 7/2004 | Ju |
| 6,791,133 | B2 | 9/2004 | Farooq et al. |
| 6,794,904 | B2 | 9/2004 | Ooishi et al. |
| 6,828,666 | B1 | 12/2004 | Herrell et al. |
| 6,891,258 | B1 | 5/2005 | Alexander et al. |
| 6,961,231 | B1 | 11/2005 | Alexander et al. |
| 6,975,199 | B2 | 12/2005 | Long et al. |
| 7,071,807 | B1 | 7/2006 | Herbert |
| 7,109,838 | B2 | 9/2006 | Brennan et al. |
| 7,250,826 | B2 | 7/2007 | Gabara |
| 7,429,899 | B2 | 9/2008 | Gabara |
| 7,446,389 | B2 | 11/2008 | Cornelius |
| 7,501,903 | B2 | 3/2009 | Gabara |
| 7,508,280 | B2 | 3/2009 | Gabara |
| 7,511,588 | B2 | 3/2009 | Gabara |
| 7,518,881 | B2 | 4/2009 | Cornelius |
| 7,701,319 | B2 | 4/2010 | Kitamura et al. |
| 7,786,836 | B2 | 8/2010 | Gabara |
| 8,068,004 | B1 | 11/2011 | Chong et al. |
| 8,138,876 | B2 | 3/2012 | Ding et al. |
| 2002/0085334 | A1 | 7/2002 | Figueroa et al. |
| 2002/0101702 | A1 | 8/2002 | Maki, Jr. |
| 2003/0001287 | A1 | 1/2003 | Sathe |
| 2003/0062602 | A1 | 4/2003 | Frutschy et al. |
| 2005/0212127 | A1 | 9/2005 | Savastiouk et al. |
| 2006/0128059 | A1 | 6/2006 | Ahn et al. |
| 2006/0138591 | A1 | 6/2006 | Amey et al. |
| 2006/0170527 | A1 | 8/2006 | Braunisch |
| 2006/0284718 | A1 | 12/2006 | Baumgartner et al. |
| 2007/0247268 | A1 | 10/2007 | Oya et al. |
| 2007/0268105 | A1 | 11/2007 | Walls |
| 2008/0084265 | A1 | 4/2008 | Kitamura et al. |
| 2008/0129394 | A1 | 6/2008 | Kissing et al. |
| 2008/0296697 | A1 | 12/2008 | Hsu et al. |
| 2008/0297299 | A1 | 12/2008 | Yun et al. |
| 2008/0309442 | A1 | 12/2008 | Hebert |
| 2008/0315356 | A1 | 12/2008 | Reisner |
| 2009/0039916 | A1 | 2/2009 | Buchmann et al. |
| 2009/0115050 | A1 | 5/2009 | Kasuya et al. |
| 2009/0180236 | A1 | 7/2009 | Lee et al. |
| 2010/0026368 | A1 | 2/2010 | Tang et al. |
| 2010/0067154 | A1 | 3/2010 | Deng et al. |
| 2010/0109133 | A1 | 5/2010 | Ito et al. |
| 2010/0127937 | A1 | 5/2010 | Chandrasekaran et al. |
| 2010/0327424 | A1 | 12/2010 | Braunisch et al. |
| 2011/0084765 | A1* | 4/2011 | Kim et al. ............. 330/277 |
| 2011/0095395 | A1 | 4/2011 | Ellul et al. |
| 2011/0169171 | A1* | 7/2011 | Marcoux ............. 257/774 |
| 2011/0215472 | A1 | 9/2011 | Chandrasekaran |
| 2011/0259411 | A1* | 10/2011 | Liu ............. 136/256 |
| 2011/0291288 | A1 | 12/2011 | Wu et al. |
| 2012/0146209 | A1 | 6/2012 | Hu et al. |
| 2012/0147578 | A1 | 6/2012 | Jin et al. |

OTHER PUBLICATIONS

U.S. Appl. No. 13/329,832, filed Dec. 19, 2011, Rahman et al.
U.S. Appl. No. 13/075,059, filed Mar. 29, 2011, Jenkins et al.
"ALLVIA to Present Latest Data for Silicon Interposers and Embedded Capacitors at IMAPS 2011," Marketwire.com, Sep. 28, 2011, downloaded Jan. 17, 2012 <http://www.marketwire.com/printer_friendly?id=1566307>.
"Xilinx Uses TSV+MLM interposers for 28nm FPGA—BetaBlog," Betasights.com, Nov. 8, 2010, downloaded Jan. 17, 2012. <betasights.net/wordpress/?p=1189>.
Braunisch, Henning et al., "High-Speed Performance of Silicon Bridge Die-to-Die Interconnects," *IEEE International Conference on Electrical Performance of Electronic Packages and Systems(EPEPS-2011)* Oct. 23, 2011, pp. 95-98, EPEPS Administration, Urbana, Illinois, USA, http://epeps.ece.illinois.edu/.
Carlson, J. et al., "A Stackable Silicon Interposer with Integrated Through-Wafer Inductors," *Proc. of the 57th Electronic Components and Technology Conference*, May 29, 2007, pp. 1235-1238, IEEE, Piscataway, New Jersey, USA.
Galal, Sherif et al., "Broadband ESD Protection Circuits in CMOS Technology", *IEEE Journal of Solid-State Circuits*, Dec. 2003, pp. 2334-2340, vol. 38, No. 12, IEEE, Piscataway, New Jersey, USA.
Kossel, Marcel et al., "A T-Coil-Enhanced 8.5 Gb/s High-Swing SST Transmitter in 65 nm Bulk CMOS With <—16 dB Return Loss Over 10 GHz Bandwidth", *IEEE Journal of Solid-State Circuits*, Dec. 2008, pp. 2905-2920, vol. 43, No. 12, IEEE, Piscataway, New Jersey, USA.
Lee, Heeseok et al., "Power Delivery Network Design for 3D SIP Integrated over Silicon Interposer Platform," *Proc. of the 57th Electronic Components and Technology Conference*, May 29, 2007, pp. 1193-1198, IEEE, Piscataway, New Jersey, USA.
Pillai, Edward et al., "Novel T-Coil Structure and Implementation in a 6.4-Gb/s CMOS Receiver to Meet Return Loss Specifications", *Proc. of the 57th Electronic Components and Technology Conference*, May 29, 2007, pp. 147-153, IEEE, Piscataway, New Jersey, USA.
Telli, Ali, "Practical performance of planar spiral inductors," *Proceedings of the 2004 11th IEEE International Conference on Electronics, Circuits and Systems*, Dec. 13, 2004, pp. 487-490, IEEE, Piscataway, New Jersey, USA.
Vishay Intertechnology, *An Introduction to Substrate PIMIC (Passive Integrated Microelectronic Interconnect Circuitry) Technology*, Tech Note 61082, Mar. 27, 2007, pp. 1-13, Vishay Intertechnology, Malvern, Pennsylvania, USA.
Mori, Toshiaki et al., "Developement of a New Interposer Including Embedded Thin Film Passive Elements," *IEEE Transactions on Advanced Packaging*, May 2009, pp. 503-508, vol. 32, No. 2, IEEE, Piscataway, New Jersey, USA.
U.S. Appl. No. 13/416,640, filed Mar. 9, 2012, Abugharbieh et al.
Yoon, Jun-Bo et al., "Surface Micromachined Solenoid On-Si and On-Glass Inductors for RF Applications,"*IEEE Electron Device Letters*, Sep. 1999, pp. 487-489, vol. 20, No. 9, IEEE, Piscataway, New Jersey, USA.
Yue, C. Patrick, "On-Chip Spiral Inductors with Patterned Ground Shields for Si-Based RF IC's," *IEEE Journal of Solid-State Circuits*, May 1998, pp. 743-752, vol. 33, No. 5, IEEE, Piscataway, New Jersey, USA.
Selmi, L. et al., "Small-Signal MMIC Amplifiers with Bridged T-Coil Matching Networks," IEEE Journal of Solid-State Circuits, Jul. 1, 1992, pp. 1093-1096, vol. 27, No. 7, IEEE, Piscataway, New Jersey, USA.

* cited by examiner

US 9,406,738 B2

INDUCTIVE STRUCTURE FORMED USING THROUGH SILICON VIAS

FIELD OF THE INVENTION

One or more embodiments disclosed within this specification relate to integrated circuits (ICs). More particularly, one or more embodiments relate to an inductor formed using through silicon vias of an IC.

BACKGROUND

The operational speed of integrated circuits (ICs) continues to increase with modern ICs routinely operating in the radio frequency (RF) range. The RF operational frequency range of ICs makes implementation of passive circuit elements such as inductors desirable. The formation of high quality inductors within ICs, however, has been problematic.

For example, one technique for forming inductors within an IC relates to the implementation of spiral inductors. A spiral inductor can be formed using a metallization layer of the IC. A spiral inductor generally is characterized by concentric coils configured in a same plane as the metallization layer use to implement the inductor. Spiral inductors typically suffer from a variety of disadvantages. These disadvantages can include, but are not limited to, low quality factor, consumption of significant area on the IC, and high vulnerability to noise coupling induced by surrounding circuit elements within the IC.

SUMMARY

One or more embodiments disclosed within this specification relate to integrated circuits (ICs) and, more particularly, to an inductor formed using through silicon vias (TSVs) of an IC.

An embodiment can include an inductor for an IC. The inductor can include a first turn having a first TSV coupled to a second TSV, and a third TSV coupled to the second TSV.

The first TSV can include a first end and a second end. The second TSV also can include a first end and a second end. The second end of the first TSV can be coupled to the second end of the second TSV using a first conductive material. The third TSV can include a first end and a second end. The first end of the third TSV can be coupled to the first end of the second TSV using a second conductive material. The second conductive material can be the same as, or different from, the first conductive material.

The first end of the first TSV can include an input node of the inductor. The second end of the third TSV can include an output node of the inductor. In one aspect, the input node and the output node can be located on opposing sides of a die that includes the first, second, and third TSVs.

The inductor also can include a fourth TSV having a first end and a second end. The second end of the third TSV can be coupled to second end of the fourth TSV using a third conductive material. The third conductive material can be the same as one, both, or neither of the first and second conductive materials. The first end of the first TSV can include an input node. The first end of the fourth TSV can include an output node of the inductor. In another aspect, the input node of the inductor and the output node of the inductor can be located on a same side of a die that includes the first, second, third, and fourth TSVs.

In one aspect, the first conductive material can include a first metallization layer of a die within which the first, second, and third TSVs are implemented. The second conductive material can include a second metallization layer of the die.

In another aspect, the first conductive material can include a metallization layer of a first die within which the first, second, and third TSVs are implemented. The second conductive material can include a metallization layer of a second die.

In still another aspect, the first, second, and third TSVs are implemented within a first die. Accordingly, the first conductive material can include a metallization layer of a second die coupled to the first die. The second conductive material can include a metallization layer of a third die coupled to the first die.

Another embodiment can include an inductor for an IC. The inductor can include a first TSV having a first end and a second end, a second TSV having a first end and a second end, a first bottom formed of a first conductive material configured to couple the second end of the first TSV with the second end of the second TSV, a third TSV having a first end and a second end, and a top formed of a second conductive material and configured to couple the first end of the second TSV with the first end of the third TSV. The second conductive material can be the same as, or different from, the first conductive material.

An input node of the inductor and an output node of the inductor can be located on opposing sides of a die that includes the first, second, and third TSVs.

The inductor can include a fourth TSV having a first end and a second end and a second bottom formed of a third conductive material configured to couple the second end of the third TSV with the second end of the fourth TSV. The third conductive material can be the same as one, both, or neither of the first and second conductive materials. An input node of the inductor and an output node of the inductor can be located on a same side of a die that includes the first, second, third, and fourth TSVs.

In one aspect, the first bottom can be formed using a first metallization layer of a die within which the first, second, and third TSVs are implemented. The top can be formed using a second metallization layer of the die.

In another aspect, the first bottom can be formed using a metallization layer of a first die within which the first, second, and third TSVs are implemented. The top can be formed using a metallization layer of a second die mounted to the first die.

In still another aspect, the first, second, and third TSVs can be implemented within a first die. The first bottom can be formed using a metallization layer of a second die coupled to the first die. The top can be formed using a metallization layer of a third die coupled to the first die.

Another embodiment can include an inductor. The inductor can include a plurality of turns implemented substantially through a die of an integrated circuit. At least one of the turns can be oriented substantially perpendicular to a plane defined by a process layer of the die.

The at least one of the turns can include a first TSV and a second TSV coupled by a first conductive material. The inductor can include a third TSV coupled to the second TSV using a second conductive material. The second conductive material can be the same as, or different from, the first conductive material.

DETAILED DESCRIPTION OF THE DRAWINGS

While the specification concludes with claims defining features of one or more embodiments that are regarded as novel, it is believed that the one or more embodiments will be better understood from a consideration of the description in conjunction with the drawings. As required, one or more detailed embodiments are disclosed within this specification. It should be appreciated, however, that the one or more embodiments are merely exemplary. Therefore, specific structural and functional details disclosed within this specification are not to be interpreted as limiting, but merely as a basis for the claims and as a representative basis for teaching one skilled in the art to variously employ the one or more embodiments in virtually any appropriately detailed structure. Further, the terms and phrases used herein are not intended to be limiting, but rather to provide an understandable description of the one or more embodiments disclosed herein.

One or more embodiments disclosed within this specification relate to integrated circuits (ICs) and, more particularly, to an inductor formed using through silicon vias (TSVs) within an IC. In general, a TSV is a vertical conductive path that extends completely, or substantially, through a die of an IC. Whereas a conventional via typically couples two adjacent metallization layers together, a TSV can electrically couple a node on a top surface of a die through which the TSV extends with a different node on a bottom surface of the same die.

Forming inductors utilizing TSVs facilitates the creation of high quality solenoidal inductors that do not consume substantial IC area at the expense of other circuit elements. Inductors formed in accordance with the one or more embodiments disclosed within this specification can be characterized by high quality factors and are suitable for use within a variety of different circuits. For instance, inductors as described within this specification can be utilized within voltage controlled oscillators (VCOs), T-coil networks, other peaking networks for input/output (I/O) circuits intended to cancel input capacitance and improve return loss and/or bandwidth, or the like.

Figure 1:
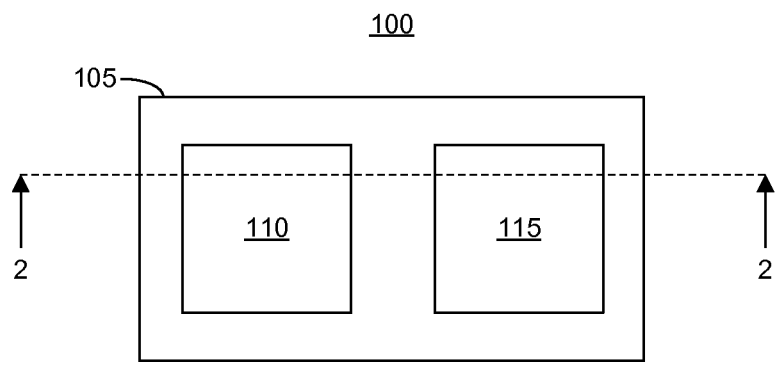
FIG. 1 is a first block diagram illustrating a topographic view of a multi-die integrated circuit (IC) structure in accordance with an embodiment disclosed within this specification.

FIG. 1 is a first block diagram illustrating a topographic view of a multi-die IC structure in accordance with an embodiment disclosed within this specification. In general, a "multi-die IC" refers to an IC structure that includes two or more dies that are coupled to one another and located within a single IC package. In one aspect, multi-die IC structure 100 (IC structure 100) illustrates one approach to stacking multiple dies within a single IC package. IC structure 100 can include a silicon interposer (interposer) 105, a die 110, and a die 115.

Interposer 105 can be a die having a planar surface on which dies 105 and 110 can be horizontally stacked. As shown, dies 105 and 110 can be located on the planar surface of interposer 105 side-by-side. Although implemented with two horizontally stacked dies within FIG. 1, IC structure 100 also can be implemented with more than two dies being horizontally stacked. In another embodiment, die 115 can be stacked vertically on top of die 110. In still another embodiment, interposer 105 can be used as an intermediate layer between two vertically stacked dies. In that case, interposer 105 can isolate vertically stacked dies from one another within an IC package.

Interposer 105 can provide a common mounting surface and electrical coupling point for two or more dies of a multi-die IC. Interposer 105 can serve as an intermediate layer for interconnect routing between dies or as a ground or power plane for the multi-die IC. Interposer 105 can be implemented with a silicon wafer substrate, whether doped or un-doped with an N-type and/or a P-type impurity. The manufacturing of interposer 105 can include one or more additional process steps that allow the deposition of one or more layer(s) of metal interconnect. These metal interconnect layers can include aluminum, gold, copper, nickel, various silicides, and/or the like.

Interposer 105 can be manufactured using one or more additional process steps that allow the deposition of one or more dielectric or insulating layer(s) such as, for example, silicon dioxide. In one embodiment, interposer 105 can be implemented as a purely passive structure that includes no active circuit elements. In another embodiment, interposer 105 can be manufactured using one or more additional process steps that allow the creation of active resources such as, for example, transistor devices and/or diodes. As noted, interposer 105 is, in general, a die and is characterized by the presence of one or more TSVs as will be described in greater detail within this specification.

IC structure 100 is presented for purposes of illustration and is not intended as a limitation of the one or more embodiments disclosed within this specification. In this regard, interposer 105, die 110, and die 115 can be implemented in any of a variety of different forms. For example, in addition to the functionality already described, one or more of interposer 105 and dies 110 and/or 115 can be implemented as a memory, a processor, a programmable IC, or the like. IC structure 100 can be implemented to include various combinations of such circuitry.

Figure 2:
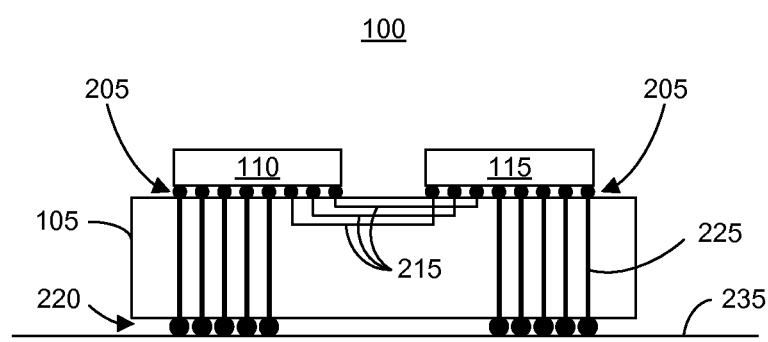
FIG. 2 is a second block diagram illustrating a cross-sectional side view of a multi-die IC structure in accordance with another embodiment disclosed within this specification.

FIG. 2 is a second block diagram illustrating a cross-sectional side view of a multi-die IC structure in accordance with another embodiment disclosed within this specification. More particularly, FIG. 2 illustrates a view of IC structure 100 of FIG. 1 taken along cut-line 2-2. As such, like numbers will be used to refer to the same items throughout this specification to the extent possible.

Referring to FIG. 2, each of dies 110 and 115 can be electrically coupled to interposer 105 via solder balls 205. In one embodiment, solder balls 205 can be implemented in the form of "micro bumps." Each of solder balls 205 can serve to physically attach dies 110 and 115 to interposer 105. Through solder balls 205, for example, interposer 105 is coupled to die 110. Similarly, through solder balls 205, die 115 is coupled to interposer 105.

Although the coupling of dies 110 and 115 to interposer 105 is accomplished through solder balls 205, a variety of other techniques can be used to couple interposer 105 to dies 110 and 115. For example, bond wires or edge wires can be used to couple dies of a multi-die IC to an underlying interposer. In another example, an adhesive material can be used to physically attach dies 110 and 115 to interposer 105. As such, the coupling of dies 110 and 115 to interposer 105 via solder balls 205, as illustrated within FIG. 2, is provided for purposes of illustration and is not intended to limit the one or more embodiments disclosed within this specification.

Conductive material such as one or more metallization layers within interposer 105 can be used to pass inter-die signals between dies 110 and 115. For example, interconnect 215 can be coupled to selected ones of solder balls 205 on each respective die 110 and 115 to allow the exchange of inter-die signals between dies 110 and 115. In addition, interposer 105 can be implemented with multiple conductive layers that can be coupled together with vias (not shown). Accordingly, interconnect 215 can be implemented within two or more conductive layers coupled together using vias within interposer 105. The use of multiple conductive layers to implement interconnects within interposer 105 allows a greater number of signals to be routed and more complex routing of signals to be achieved within interposer 105.

Within this specification, the same reference characters are used to refer to terminals, signal lines, wires, and their corresponding signals. In this regard, the terms "signal," "wire," "connection," "terminal," and "pin" may be used interchangeably, from time-to-time, within this specification. It also should be appreciated that the terms "signal," "wire," or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Solder balls 220 can be used to electrically couple IC structure 100 to a surface 235. In one embodiment, solder balls 220 can be implemented in the form of "C4 bumps." Surface 235 can represent, for example, a multi-die IC package in which IC structure 100 is implemented. Solder balls 220 further can couple IC structure 100 directly to a node external to the multi-die IC package. For example, solder balls 220 can be used to physically attach interposer 105 to surface 235. As shown within FIG. 2, the first planar surface of interposer 105 can be physically coupled to dies 110 and 115. The second planar surface of interposer 105 can be physically coupled to surface 235.

TSVs 225 represent vias that, when filled with conductive material, form an electrical connection that vertically transverses, e.g., extends through, most, all, or substantially all, of interposer 105. TSVs 225 can be implemented by drilling or etching an opening into interposer 105 that extends from a first planar surface, i.e., the surface to which solder balls 205 are coupled, through to a second planar surface, i.e., the surface to which solder balls 220 are coupled. Conductive material then can be deposited within TSVs 225. Examples of conductive material that can be used to fill TSVs 225 can include, but are not limited to, copper, aluminum, gold, copper, nickel, various silicides, and/or the like. TSVs 225, in combination with solder balls 220, couple die 110 to surface 235.

It should be appreciated that while TSVs 225 are illustrated as coupling directly with solder balls 205 and solder balls 220, in one or more other embodiments, one or both ends of one or more TSVs 225 can couple to interconnect within interposer 105. For example, interposer 105 can be implemented to include one or more conductive layers, e.g., metallization layers that form the upper-most or bottom-most layers of the die. In such cases, rather than extending through the entirety of interposer 105, a TSV 225 can couple a solder ball 220 with a solder ball 205 using interconnect formed using the metallization layers. For example, a TSV 225 can couple directly with a solder ball 220, extend upward, and couple to interconnect that couples to a solder bump 205. In another example, a TSV 225 can couple directly to a solder bump 205, extend downward, and couple to interconnect that couples to a solder ball 220. Still, as noted, TSVs 225 can couple directly to solder balls 205 and solder balls 220 without utilizing interconnect formed within interposer 105.

The use or formation of conductive material within interposer 105, however, does not preclude the use or formation of conductive material or traces on the top and/or bottom surface of interposer 105. For example, one or more additional process steps can be performed that deposit conductive material, e.g., metallization layers, in traces or channels on the top and/or bottom surface of interposer 105. Traces or channels of conductive material on the top and/or bottom surface of interposer 105, as well as interconnect formed of other metallization layers, can be used to couple one or more TSVs 225 together.

In one or more embodiments, TSVs 225 can be used to form inductive circuit elements. By coupling a plurality of TSVs 225 together using conductive material, whether on a surface of interposer 105, within interposer 105, or using conductive material in one or more other dies coupled to interposer 105, one or more turns of an inductive circuit element can be formed. The resulting inductive circuit element can be characterized by a high quality factor, or "Q," due, at least in part, to the increased conductivity of the TSVs and the high resistive characteristics of the material used to form interposer 105. The resulting inductive circuit elements can be incorporated within circuits such as, for example, VCOs, I/Os, and the like.

Figure 3:
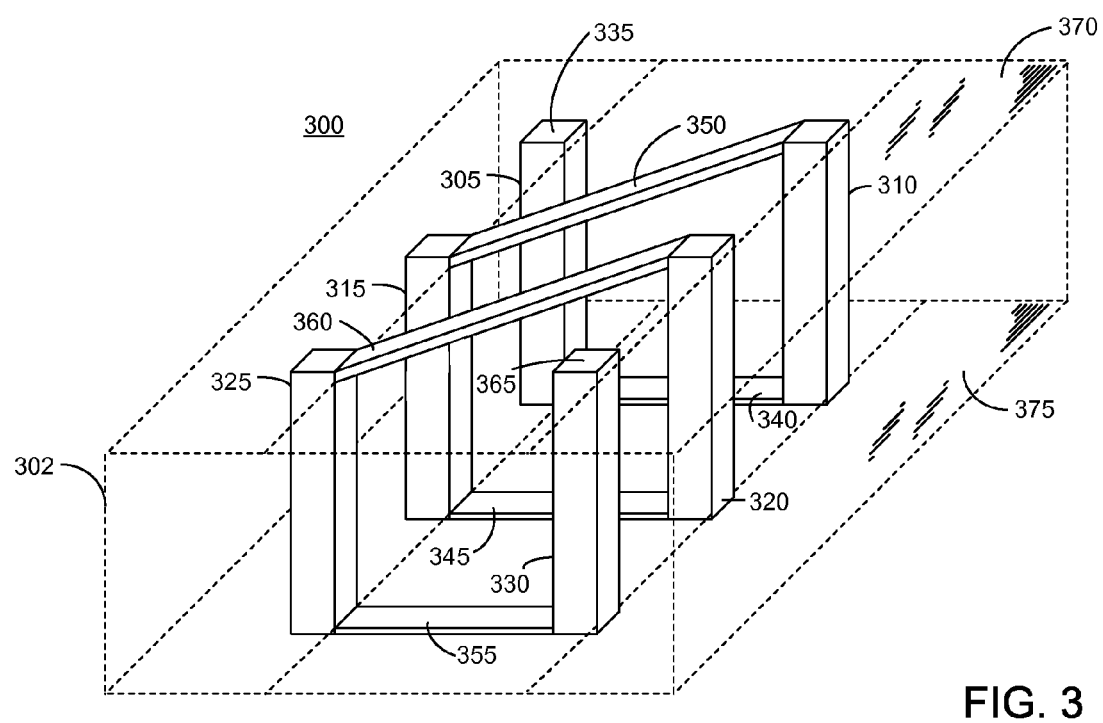
FIG. 3 is a first perspective view of an inductor configured in accordance with another embodiment disclosed within this specification.

FIG. 3 is a first perspective view of an inductor 300 configured in accordance with another embodiment disclosed within this specification. Inductor 300 can be implemented within, or using, an interposer 302. Interposer 302 can be implemented substantially similar to interposer 105 described with reference to FIGS. 1 and 2. It should be appreciated that FIG. 3 is provided to illustrate various aspects of inductive structure 300 described below. In this regard, FIG. 3 is not intended to be a scale representation of inductor 300 and/or interposer 302.

Inductor 300 can be formed as a solenoidal inductor using TSVs 305-330 as shown. Each of TSVs 305-330 can be substantially parallel to one another. Further, each of TSVs 305-330 can have a first end and a second end that is distal from the first end. For purposes of reference and illustration, the first end of each of TSVs 305-330 can refer to the upper end, or portion, of each of TSVs 305-330. The second end of each of TSVs 305-330 can refer to the lower end, or portion, of each of TSVs 305-330. A pair of TSVs including TSV 305 and TSV 310 form a first turn of inductor 300. The first end of TSV 305, also labeled 335, can be included within, or form, an input node of inductor 300. As shown, the second end of TSV 305 is coupled to the second end of TSV 310 using conductive material forming a "bottom" 340 of the first turn.

The first-top and second-bottom convention is used throughout this specification in relation to TSVs. In this regard, the term "top" and the term "bottom" are used as labels for opposing ends or surfaces. As such, the terms are not intended to infer that the particular structure cannot be re-oriented by 180 degrees, e.g., flipped so that the top and bottom are reversed. Similarly, the term first and second as applied to structural elements are used as differentiating labels and are not intended to infer a particular ordering.

The pair of TSVs including TSV 315 and TSV 320 form a second turn of inductor 300. The second end of TSV 315 is coupled to the second end of TSV 320 using conductive material forming a bottom 345 of the second turn. The first turn can be coupled to the second turn via top 350. Top 350 can be formed of conductive material coupling the first end of TSV 310 with the first end of TSV 315. For purposes of reference and description, top 350 can be considered the top of the first turn.

The pair of TSVs including TSV 325 and TSV 330 form a third turn of inductor structure 300. The second end of TSV 325 is coupled to the second end of TSV 330 using conductive material forming a bottom 355 of the third turn. The second turn can be coupled to the third turn via top 360. Top 360 can be formed of conductive material coupling the first end of TSV 320 with the first end of TSV 325. For purposes of reference and description, top 360 can be considered the top of the second turn. The first end of TSV 330, labeled 365, can be included within, or form, an output node of inductive structure 300.

The three-dimensional box formed of dotted lines illustrates the relative positioning of interposer 302 within which inductor 300 is implemented. The relative positioning of interposer 302 illustrates that TSVs 305-330 extend substantially through interposer 302. Conductive material used to form tops 350 and 360 and bottoms 340, 345, and 355 can be formed using a metallization layer. Tops 350 and 360 and bottoms 340, 345, and 355 can be substantially perpendicular to TSVs 305-330. The metallization layer used to form tops 350 and 360 can be implemented on a top surface 370 of interposer 302. The bottoms 340, 345, and 355 can be implemented on a bottom surface 375 of interposer 302. It should be appreciated, however, that tops 350 and 360 and/or bottoms 340, 345, and 355 can be implemented using metallization layers within interposer 302 in one or more other embodiments. In either case, the turns of inductor 300 are substantially perpendicular to the top surface 370, the bottom surface 375, and the various process layers (not shown) used to form interposer 302.

Inductor 300 illustrates an embodiment in which input node 335 and output node 365 are located on a same side, or in this case a same surface, of interposer 302. Thus, for example, a die mounted on top surface 370 of interposer 302 can access both the input node and the output node via solder balls, interconnect, etc. to incorporate inductor 300 within any circuits implemented within the die. Other configurations with fewer turns or additional turns can be implemented. In another example, half-turns can be implemented so that the input node is located on one side or surface, e.g., top surface 370 or bottom surface 375, and the output node is located on the other side or surface. It should be appreciated that the term "side" can refer to one or more process layers closer to one surface of a die compared to the opposing surface. For example, the "N" process layers closest to a particular surface of the die can be the "side" of the die, wherein N can be an integer value such as 1, 2, 3, 4, 5, etc. In this regard, a node of the inductor can be on a particular side of interposer 302 without necessarily being located on the same surface of interposer 302. When on a surface of interposer 302, however, the node is understood to be on the same side as the surface to which reference is made.

Figure 4:
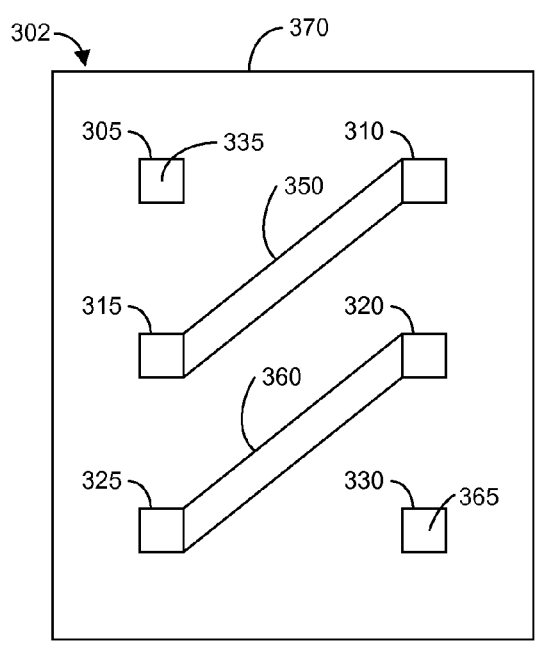
FIG. 4 is a third block diagram illustrating a topographical view of a top surface of the interposer of FIG. 3 in accordance with another embodiment disclosed within this specification.

FIG. 4 is a third block diagram illustrating a topographical view of top surface 370 of interposer 302 in accordance with another embodiment disclosed within this specification. Top surface 370 can be a surface of interposer 302 to which, for example, one or more dies can be attached as illustrated in FIGS. 1 and 2. Additional dies coupled to top surface 370 of interposer 302 are not illustrated to better illustrate the configuration of inductor 300.

As shown, a top portion of each of TSVs 305-330 is exposed through surface 370. Input node 335 also is visible along with output node 365. Top 350 is visible which couples the first end of TSV 310 with the first end of TSV 315. Similarly, top 360 is visible, which couples the first end of TSV 320 and the first end of TSV 325. Bottoms 340, 345, and 350, however, are not visible within FIG. 4.

Figure 5:
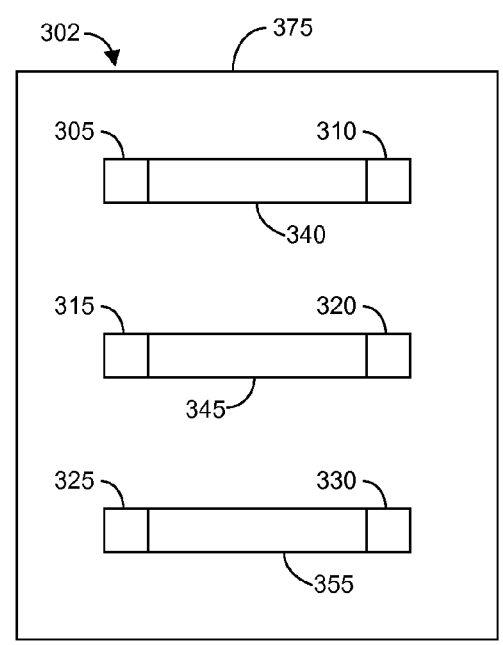
FIG. 5 is a fourth block diagram illustrating a topographical view of a bottom surface of the interposer of FIG. 3 in accordance with another embodiment disclosed within this specification.

FIG. 5 is a fourth block diagram illustrating a topographical view of bottom surface 375 of interposer 302 in accordance with another embodiment disclosed within this specification. Bottom surface 370 also can be a surface of interposer 302 to which one or more dies can be attached. Additional dies coupled to bottom surface 375 of interposer 302 are not illustrated to better illustrate the configuration of inductor 300.

As shown, a bottom portion of each of TSVs 305-330 is exposed through surface 375. Viewing bottom surface 375, structures such as tops 350 and 360 are not visible. Bottom 340 coupling the second end of TSV 305 with the second end of TSV 310 is visible. Bottom 345 coupling the second end of TSV 315 with the second end 320 is visible. Further bottom 355 coupling the second end of TSV 325 with the second end 330 is visible.

A high quality factor inductive structure such as inductor 300 of FIGS. 3-5, can be formed using the various techniques disclosed within this specification. TSVs, for example, have low resistivity due, at least in part, to the size of the conductive, e.g., metal, structures. The resistivity can be particularly low when compared to other wire or routing structures formed using metallization layers within dies. The low resistivity contributes to the high quality factor of an inductor formed using TSVs such as inductor 300. The tops and bottoms of loops formed on the top and bottom surface of the interposer can be formed with widths, thickness, or both that are larger than those used to form wires or traces within the interposer or other dies coupled thereto. This increased size of metal traces to form tops and/or bottoms also can contribute to the high quality factor of the inductor.

The material used to form an interposer, e.g., interposer 302, is typically highly resistive. By utilizing a vertical configuration for an inductive structure, and particularly a solenoidal inductive structure, e.g., such as inductor 300, magnetic flux of the inductor is substantially, or mostly, confined within the interposer. Confining the magnetic flux within the interposer helps to reduce and/or eliminate substrate and power grid losses that arise due to Eddy currents. Moreover, cross-talk with other circuitry of a multi-die IC can be significantly reduced since the inductor is confined to the interposer. Finally, active area of dies that may be coupled to the interposer is not consumed by the formation of an inductor such inductor 300.

Figure 6:
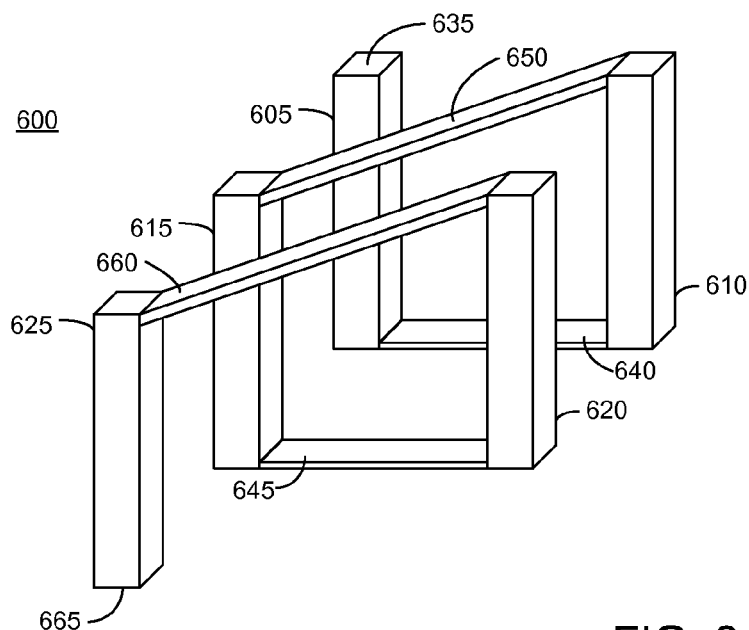
FIG. 6 is a second perspective view of an inductor configured in accordance with another embodiment disclosed within this specification.

FIG. 6 is a second perspective view of an inductor 600 configured in accordance with another embodiment disclosed within this specification. Inductor 600 can be implemented with a configuration similar to that illustrated with reference to FIG. 3. Within FIG. 6, inductor 600 is formed using TSVs 605, 610, 615, 620, and 625. Bottom 640 couples the second end of TSV 605 with the second end of TSV 610. Bottom 645 couples the second end of TSV 615 with the second end of TSV 620. Top 650 couples the first end of TSV 610 with first end of TSV 615. Top 660 couples the first end of TSV 620 with the first end of TSV 625.

Inductor 600 omits TSV 630 and bottom 655. As such, input node 635 of inductor 600 is formed to include the first end of TSV 605. Output node 665 of inductor 600, however, is formed to include the second end of TSV 625. Accordingly, input node 635 and output node 665 are located on opposing surfaces of the interposer (not shown) within which inductor 600 is constructed. For example, input node 635 can be located in a top surface of the interposer while output node 665 is located in a bottom surface of the interposer.

Figure 7:
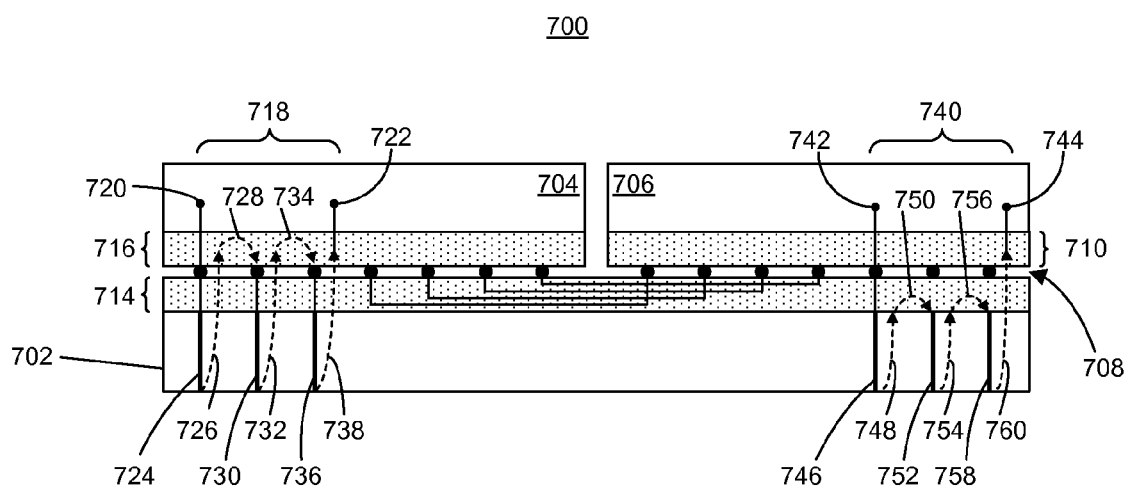
FIG. 7 is a fifth block diagram illustrating a cross-sectional side view of a multi-die IC structure in accordance with another embodiment disclosed within this specification.

FIG. 7 is a fifth block diagram illustrating a cross-sectional side view of an IC structure 700 in accordance with another embodiment disclosed within this specification. FIG. 7 illustrates IC structure 700, which is configured substantially similar to IC structure 100 of FIGS. 1 and 2. More particularly, FIG. 7 illustrates a multi-die IC structure within which different inductors are formed utilizing techniques described within this specification.

As shown, IC structure 700 includes an interposer 702, a die 704, and a die 706. Die 704 can be communicatively coupled to interposer 702 through solder balls 708. Similarly, die 706 can be communicatively coupled to interposer 702 through solder balls 708. For ease of illustration, only selected circuit structures, e.g., selected solder balls 708 and selected TSVs, are illustrated in FIG. 7. Other structures have been omitted. It should be appreciated that FIG. 7 is shown for purposes of illustration and, as such, is not intended as a limitation of the one or more embodiments disclosed within this specification.

Interposer 702 can include one or more metallization layers 714 shown as a shaded region. Interposer 702, for example, can include four different metallization layers within which interconnects can be formed. Interconnects within metallization layers 714 can be formed using one or more of the individual metallization layers 714. Vias can be used to form interconnects by coupling adjacent ones of the metallization layers 714 together. Die 704 can include one or more metallization layers 716 shown as a shaded region. Interconnects implemented within metallization layers 716 can be formed using one or more of metallization layer 716. Vias can be used to form interconnects by coupling adjacent ones of metallization layers 716. Die 706 can include one or more metallization layers 710 shown as a shaded region. Interconnects implemented within metallization layers 710 can be formed using one or more of metallization layers 710. As noted, vias can be used to form interconnects by coupling adjacent ones of metallization layers 710.

A first inductor 718 can be formed that utilizes a metallization layer that can be applied to a bottom surface of interposer 702 and metallization layers within die 704 to form the turns of inductor 718. More particularly, the bottoms of the turns can be formed using metallization layer(s) formed on the bottom surface of interposer 702 while the tops of the turns can be formed using one or more metallization layer(s) 716 of die 704. Inductor 718 has an input node 720 and an output node 722. Each of input node 720 and output node 722 within die 704 can be coupled to circuitry (not shown) also implemented within die 704, e.g., VCOs, I/Os, etc. Input node 720 can be coupled to a first end of TSV 724 through interconnect formed of metallization layers 716, solder ball(s) 708, and interconnect formed of metallization layers 714 of interposer 702.

The second end of TSV 724 can be coupled to the second end of a different TSV (not shown) using metallization layer(s) formed on the bottom surface of interposer 702 forming a return path 726 up to die 704 through interposer 702, or a substantial portion of interposer 702. It should be appreciated that the particular view presented in FIG. 7 obscures the TSV, interconnect, and solder balls 708 used for return paths. Accordingly, return paths are indicated in FIG. 7 using dotted lines. Interconnect 728 can be formed in metallization layers 716 to couple return path 726 to further solder ball(s) 708 that couple to interconnect within interposer 702 and to a first end of TSV 730.

The second end of TSV 730 can be coupled to the second end of a different TSV (not shown) using metallization layer(s) formed on the bottom surface of interposer 702 forming return path 732 up to die 704 through interposer 702, or a substantial portion of interposer 702. Interconnect 734 can be formed in metallization layers 716 to couple return path 732 to further solder ball(s) 708 that couple to interconnect within interposer 702 and to a first end of TSV 736.

The second end of TSV 736 can be coupled to the second end of another TSV (not shown) using metallization layer(s) formed on the bottom surface of interposer 702 forming return path 738 that couples to output node 722 in die 704. In this regard, inductor 718 utilizes metallization layers located within two different dies to form loops using the TSVs.

A second inductor 740 can be formed that utilizes a metallization layer that can be applied to a bottom surface of interposer 702 and metallization layers within interposer 702 to form the turns of inductor 740. Inductor 740 can be formed having an input node 742 and an output node 744 within die 706. As shown, input node 742 and output node 744 are coupled to turns of inductor 740 using metallization layers 710 of die 706. Each of input node 742 and output node 744 within die 706 can be coupled to circuitry (not shown) within die 704. Input node 742 can be coupled to a first end of TSV 746 through interconnect within metallization layers 710, solder ball(s) 708, and interconnect within metallization layers 714 of interposer 702.

The second end of TSV 746 can be coupled to the second end of a different TSV (not shown) using metallization layer(s) formed on the bottom surface of interposer 702 forming a return path 748 up to metallization layers 714 of interposer 702. Interconnect 750 can be formed in metallization layers 714 to couple return path 748 to a first end of TSV 752. The second end of TSV 752 can be coupled to the second end of a different TSV (not shown) using metallization layer(s) formed on the bottom surface of interposer 702 forming return path 754 up to metallization layers 714 of interposer 702. Interconnect 756 can be formed in metallization layers 714 to couple return path 754 to a first end of TSV 758. The second end of TSV 758 can be coupled to the second end of another, different TSV (not shown) using metallization layer(s) formed on the bottom surface of interposer 702 forming return path 760. Return path 760 traverses through interposer 702, through metallization layers 714, solder ball(s) 708, metallization layers 710, to output node 744 within die 706.

Figure 8:
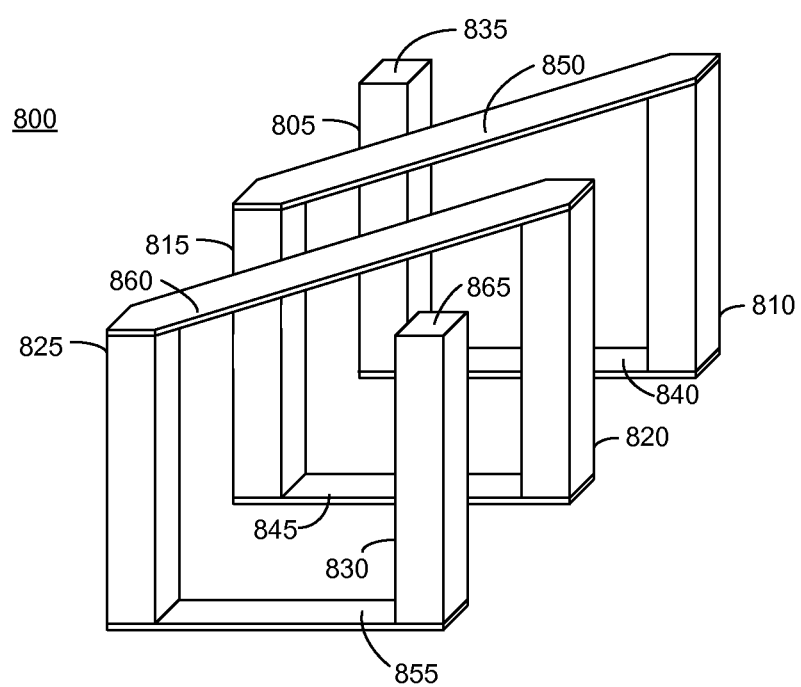
FIG. 8 is a third perspective view of an inductor configured in accordance with another embodiment disclosed within this specification.

FIG. 8 is a third perspective view of an inductor 800 configured in accordance with another embodiment disclosed within this specification. Inductor 800 can be implemented within, or using, an interposer (not shown). Inductor 800 can be implemented substantially similar to inductor 300 of FIG. 3. It should be appreciated that FIG. 8 is provided to illustrate various aspects of inductive structure 800 described below. In this regard, FIG. 8 is not intended to be a scale representation of inductor 800 or to limit the one or more embodiments disclosed within this specification.

Inductor 800 can be formed using TSVs 805-830 as shown. Each of TSVs 805-830 can have a first end and a second end that is distal to the first end. The pair of TSVs including TSV 805 and TSV 810 form a first turn of inductor 800. The first end of TSV 805, labeled 835, can be included within, or form, an input node of inductor 800. As shown, the second end of TSV 805 is coupled to the second end of TSV 810 using conductive material forming bottom 840 of the first turn.

The pair of TSVs including TSV 815 and TSV 820 form a second turn of inductor 800. The second end of TSV 815 is coupled to the second end of TSV 820 using conductive material forming a bottom 845 of the second turn. The first turn can be coupled to the second turn via top 850. Top 850 can be formed of conductive material coupling the first end of TSV 810 with the first end of TSV 815. For purposes of reference and description, top 850 can be considered the top of the first turn.

The pair of TSVs including TSV 825 and TSV 830 form a third turn of inductor structure 800. The second end of TSV 825 is coupled to the second end of TSV 830 using conductive material forming a bottom 855 of the third turn. The second turn can be coupled to the third turn via top 860. Top 860 can be formed of conductive material coupling the first end of TSV 820 with the first end of TSV 825. For purposes of reference and description, top 860 can be considered the top of the second turn. The first end of TSV 830, labeled 865, can be included within, or form, an output node of inductive structure 800.

Conductive material used to form tops 850 and 860 and bottoms 840, 845, and 855 can be formed using metallization layers. As noted, the metallization layers used to form tops 850 and 860 and bottoms 840, 845, and 855 can be implemented within the interposer within which inductor 800 is implemented, e.g., near an upper or lower surface of the interposer, or on an outer surface, e.g., a top or a bottom surface, of the interposer. In this regard, the turns of inductor 800 are substantially perpendicular to the top surface, the bottom surface, and process layers of the interposer.

Inductor 800 is presented as an example showing how tops 850 and 860 can be formed to cover each top portion of TSVs 810-825. Similarly, bottoms 840, 845, and 850 can be formed to cover the bottom of each of TSVs 810-825. It should be appreciated that the loops can be formed in a variety of ways. For example, as illustrated with respect to FIG. 7, some portion of the structures labeled as TSVs in FIG. 8 also can be formed of interconnect, e.g., upper or lower metallization layers within the interposer that are coupled by one or more vias. The interconnect can form the top-most or bottom-most portion of one or more of the TSVs.

As discussed with reference to inductor 300 of FIG. 3, inductor 800 illustrates an embodiment in which input node 835 and output node 865 are located on a same side or surface of the interposer. It should be appreciated that TSV 830 and bottom 855 can be omitted to form an inductor in which input node 835 and output node 865 are located on different sides, or extend through different surfaces, of the interposer.

Figure 9:
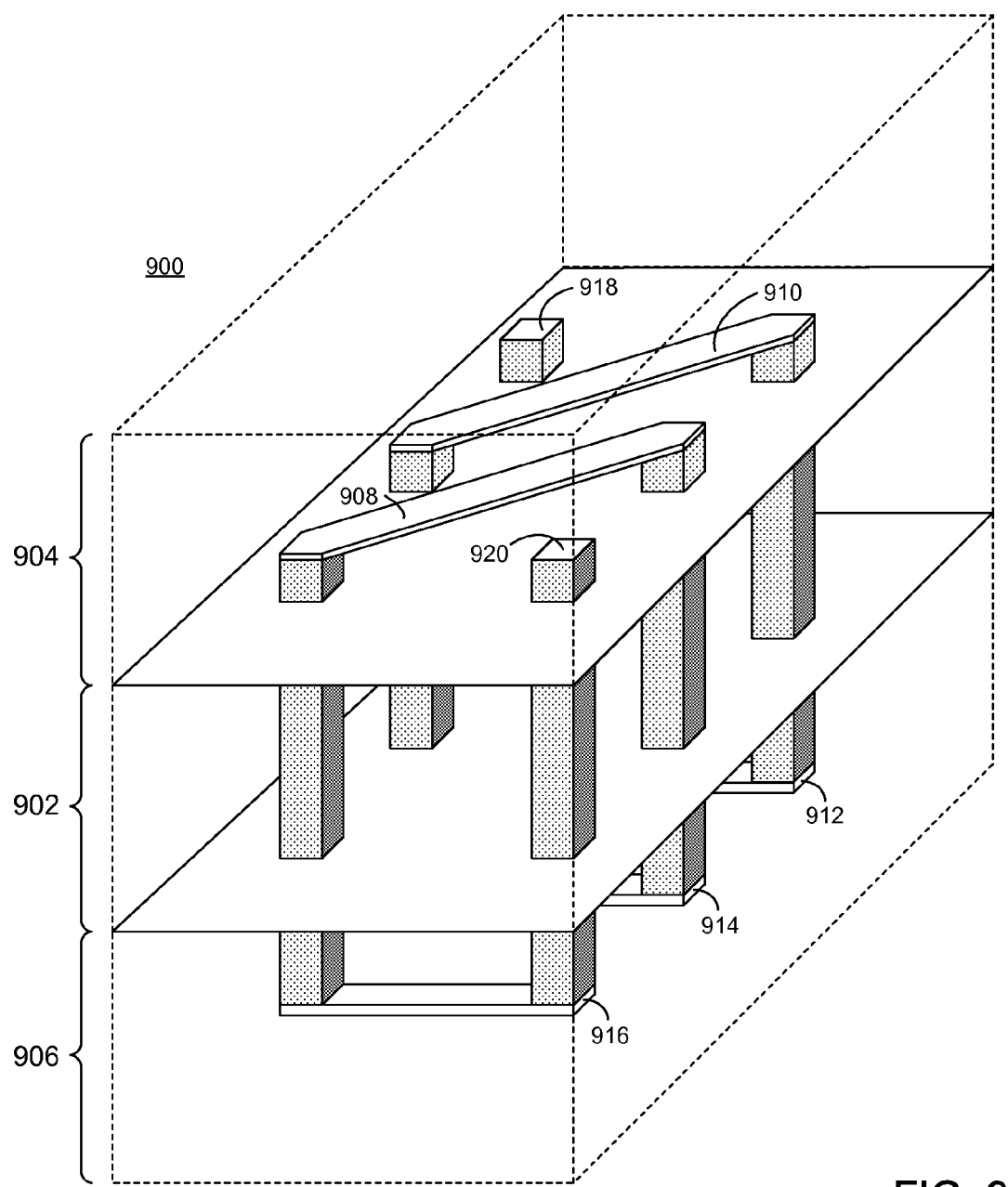
FIG. 9 is a fourth perspective view of an inductor configured in accordance with another embodiment disclosed within this specification.

FIG. 9 is a fourth perspective view of an inductor 900 configured in accordance with another embodiment disclosed within this specification. Inductor 900 can be implemented within, or using, an interposer 902. Inductor 900 can be implemented using TSVs as described. The top and bottom portions forming the various turns of inductor 900 can be formed utilizing metallization layers located within dies that are coupled to interposer 902. It should be appreciated that FIG. 9 is provided to illustrate various aspects of inductor 900 described below. In this regard, FIG. 9 is not intended to be a scale representation of inductor 900 or to limit the one or more embodiments disclosed within this specification.

The three-dimensional boxes formed of dotted lines illustrate the relative positioning of interposer 902, die 904, and die 906. The relative positioning of interposer 902 illustrates that the TSVs extend substantially through interposer 902. Conductive material used to form tops 908 and 910 and bottoms 912, 914, and 916 can be formed using interconnect formed of one or more metallization layers coupled by vias with die 904 and die 906 respectively.

Inductor 900 includes an input node 918 and an output node 920. As such, inductor 900 illustrates an embodiment in which input node 918 and output node 920 are located within a same die, i.e., die 904. It should be appreciated that by omitting bottom 916, an output node 920 can be formed thereby implementing a configuration for an inductor in which input node 918 is located in die 904 and output node 920 is located in die 906.

The one or more embodiments disclosed within this specification illustrate various inductors formed using TSVs. The TSVs can be coupled together to form one or more turns by using metallization layer(s) within the interposer, on outer surfaces of the interposer, within both the interposer and an attached die, within both dies attached to the interposer, or various combinations thereof. The resulting inductors are characterized by having a high quality factor due to low resistivity of the loops and high resistivity of the interposer. Moreover, the resulting inductors do not consume substantial IC area within dies, thereby allowing the IC area to be used for implementation of active circuit elements.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed within this specification can be embodied in other forms without departing from the spirit or essential attributes thereof. Accordingly, reference should be made to the following claims, rather than to the foregoing specification, as indicating the scope of the one or more embodiments.

What is claimed is:

1. An inductor for an integrated circuit, the inductor comprising:
   a first turn comprising a first through silicon via (TSV) coupled to a second TSV; and
   a third TSV coupled to the second TSV, wherein:
   the first TSV comprises a first end and a second end;
   the second TSV comprises a first end and a second end;
   the second end of the first TSV is coupled to the second end of the second TSV using a first conductive material;
   the third TSV comprises a first end and a second end;
   the first end of the third TSV is coupled to the first end of the second TSV using a second conductive material;
   the first, second, and third TSVs are located within a first die; and
   at least one of the first conductive material or the second conductive material is formed within a different die of the integrated circuit coupled to the first die;
   wherein the inductor is solenoidal.

2. The inductor of claim 1, wherein:
the first end of the first TSV comprises an input node of the inductor; and
the second end of the third TSV comprises an output node of the inductor.

3. The inductor of claim 2, wherein the input node and the output node are located on opposing sides of the first die comprising the first, second, and third TSVs.

4. The inductor of claim 1, further comprising:
a fourth TSV comprising a first end and a second end,
wherein the second end of the third TSV is coupled to second end of the fourth TSV using a third conductive material.

5. The inductor of claim 4, wherein:
the first end of the first TSV comprises an input node of the inductor; and
the first end of the fourth TSV comprises an output node of the inductor.

6. The inductor of claim 5, wherein the input node of the inductor and the output node of the inductor are located on a same side of a die comprising the first, second, third, and fourth TSVs.

7. The inductor of claim 1, wherein:
the second conductive material comprises a metallization layer of the first die within which the first, second, and third TSVs are implemented; and
the first conductive material comprises a metallization layer of a second die, wherein the second die is the different die.

8. The inductor of claim 1, wherein:
the first conductive material comprises a metallization layer of the first die within which the first, second, and third TSVs are implemented; and
the second conductive material comprises a metallization layer of a second die, wherein the second die is the different die.

9. The inductor of claim 1, wherein:
the first, second, and third TSVs are implemented within the first die;
the first conductive material comprises a metallization layer of a second die coupled to the first die, wherein the second die is the different die; and
the second conductive material comprises a metallization layer of a third die coupled to the first die.

10. An integrated circuit structure, comprising:
an inductor, wherein the inductor is solenoidal and comprises:
a first through silicon via (TSV) comprising a first end and a second end located within a first die of the integrated circuit structure;
a second TSV comprising a first end and a second end located within the first die;
a first bottom formed of a first conductive material configured to couple the second end of the first TSV with the second end of the second TSV;
a third TSV comprising a first end and a second end located within the first die; and
a top formed of a second conductive material and configured to couple the first end of the second TSV with the first end of the third TSV;
wherein at least one of the first bottom or the top is formed within a different die of the integrated circuit structure coupled to the first die.

11. The integrated circuit structure of claim 10, wherein an input node of the inductor and an output node of the inductor are located on opposing sides of the first die comprising the first, second, and third TSVs.

12. The integrated circuit structure of claim 10, further comprising:
a fourth TSV comprising a first end and a second end; and
a second bottom formed of a third conductive material configured to couple the second end of the third TSV with the second end of the fourth TSV.

13. The integrated circuit structure of claim 12, wherein an input node of the inductor and an output node of the inductor are located on a same side of the first die comprising the first, second, third, and fourth TSVs.

14. The integrated circuit structure of claim 10, wherein:
the top is formed using a metallization layer of the die within which the first, second, and third TSVs are implemented; and
the first bottom is formed using a metallization layer of a second die mounted to the first die, wherein the second die is the different die.

15. The integrated circuit structure of claim 10, wherein:
the first bottom is formed using a metallization layer of the first die within which the first, second, and third TSVs are implemented; and
the top is formed using a metallization layer of a second die mounted to the first die, wherein the second die is the different die.

16. The integrated circuit structure of claim 10, wherein:
the first, second, and third TSVs are implemented within the first die;
the first bottom is formed using a metallization layer of a second die coupled to the first die, wherein the second die is the different die; and
the top is formed using a metallization layer of a third die coupled to the first die.

17. The inductor of claim 8, wherein
the first conductive material is a metallization layer within the second die; and
the second conductive material is a metallization layer within a third die.

18. The integrated circuit structure of claim 16, wherein:
the metallization layer forming the first bottom is within the second die; and
the metallization layer forming the top is within the third die.

19. The inductor of claim 1, further comprising a solder ball coupling at least one of the TSVs to the at least one of the first conductive material or the second conductive material formed within the different die of the integrated circuit.

* * * * *